United States Patent [19]
Alberkrack

[11] 3,883,807
[45] May 13, 1975

[54] TUNING CONTROL SYSTEM

[75] Inventor: Jade H. Alberkrack, Phoenix, Ariz.

[73] Assignee: Motorola, Inc., Chicago, Ill.

[22] Filed: May 30, 1974

[21] Appl. No.: 474,665

[52] U.S. Cl. ................ 325/420; 325/433; 325/438; 325/453; 325/459; 325/462; 325/464; 325/468
[51] Int. Cl. ............................................ H04b 1/26
[58] Field of Search .................... 325/341, 416–420, 325/431–435, 438, 452, 453, 455, 458–462, 464, 465, 468, 470; 334/1, 7 R, 11, 13–16

[56] References Cited

UNITED STATES PATENTS

| | | | |
|---|---|---|---|
| 2,750,496 | 6/1956 | Horowitz | 325/433 |
| 3,470,481 | 9/1969 | Myers et al. | 325/432 |
| 3,482,166 | 12/1969 | Gleason | 325/341 |
| 3,497,813 | 2/1970 | Gallagher | 325/456 |
| 3,665,318 | 5/1972 | Hoffman et al. | 325/432 |
| 3,835,384 | 9/1974 | Liff | 325/419 |
| 3,845,394 | 10/1974 | Hamada | 325/470 |

*Primary Examiner*—Robert L. Griffin
*Assistant Examiner*—Jin F. Ng
*Attorney, Agent, or Firm*—Vincent J. Rauner; Michael D. Bingham; Maurice J. Jones, Jr.

[57] ABSTRACT

A phase-locked loop tuning system for a television receiver tunes the VHF and UHF local oscillators to the required frequency for the channel selected by sampling the output frequencies of the VHF and UHF local oscillators, pre-scaling these output frequencies to a different frequency range under the control of selected gated offset oscillators to produce a signal which is divided in a programmable divide-by-N counter, wherein is the desired channel number. The counter output is compared with a reference frequency to produce the control voltage for the tuner local oscillators to lock them on the proper frequency for the selected channel.

15 Claims, 3 Drawing Figures

TUNING CONTROL SYSTEM

BACKGROUND OF THE INVENTION

Television receivers have commonly employed relatively cumbersome and complex mechanical turret-type tuners for tuning the VHF channels, with a different rotary or continuous tuning provision for the UHF channels. For many receivers this required two different channel selection knobs, and the mechanical tuners occupy a relatively large amount of space immediately behind the front panel of the television receiver. This restricts the design flexibility of television receiver cabinets. In addition, adjustment of such mechanical tuners to maintain accurate tuning is a problem and the addition of remote control capability generally requires a drive motor for rotating the mechanical parts under control of remote signals.

Some mechanical tuners are equipped with programmable switches to permit them to be used to select either a UHF or a VHF channel at a tuner position by programming the tuner for the local area where the television receiver is to be used. The cumbersome mechanical turret tuner with all its disadvantages, however, is made even more complex in such applications.

It is desirable, and in the U.S. it is being required, that the selection of UHF and VHF channels be accomplished by comparable tuning means. This poses severe problems in the design of turret-type mechanical tuners in view of the large number of possible UHF channel positions which must be accommodated for television receivers sold in a large number of different market places.

The introduction of voltage variable capacitor or varactor VHF and UHF tuners has opened the way for utilization of electronic tuning of television receivers. While such tuners solve many of the problems inherent in mechanical tuners, problems of tuning voltage stability and channel selection still remain. Various analog touch tuning systems have evolved to solve the channel selection problem, but the problem of tuning voltage stability is not solved by such systems. Even in the channel selection area, most such tuning systems require some type of individual preprogramming for the UHF channels to adapt the television receiver for the particular locality in which it is used.

It is desirable to simplify the channel selection in a manner which eliminates the necessity for such custom programming of the UHF channels. In addition, it is desirable to provide a television tuning systems which electronically selects the desired channel and which overcomes the tuning voltage stability problems commonly found in electronic voltage controlled varactor television tuners.

SUMMARY OF THE INVENTION

Accordingly, it is an object of this invention to provide an improved tuner control system.

It is another object of this invention to provide an improved channel selection system for a television receiver.

It is an additional object of this invention to provide an improved channel selection system for a television receiver in which the desired channel selection is effected in the same manner irrespective of the frequency band in which the channel is located.

It is a further object of this invention to provide a stable tuning control system.

It is yet another object of this invention to provide a stable phase-locked loop control system for channel selection in a television receiver using frequency domain tuning.

In accordance with a preferred embodiment of this invention, a tuning control system for wave signal receiver, such as a television receiver, for receiving signals in more than one frequency band, includes at least one mixer circuit to one input of which the output signals from the tuner local oscillator are applied. First and second gated offset oscillators each have outputs coupled to at least one other input of the mixer. The frequencies of the first and second gated offset oscillators each are selected to have a predetermined relationship with the signal frequencies in different bands to which the receiver can be tuned. A digital channel selection circuit is provided for selecting the desired channel and for rendering operative the appropriate one of the gated offset oscillators.

The output of the mixer is supplied through a programmable frequency divider, which is controlled by the channel selection switching circuit to divide the frequency of the mixer by an amount corresponding to the channel number. This divided signal is compared in a phase comparator circuit with a reference oscillator signal to produce a control voltage used in a phase-locked loop to control the frequency of operation of the local oscillator.

The frequencies of the gated offset oscillators are selected in conjunction with the characteristics of the programmable frequency divider to permit a portion of the frequency divider to divide directly by the channel number to produce the desired frequency for comparison with the reference oscillator, irrespective of the band of frequencies to which the receiver is being tuned.

DETAILED DESCRIPTION

Figure 1:
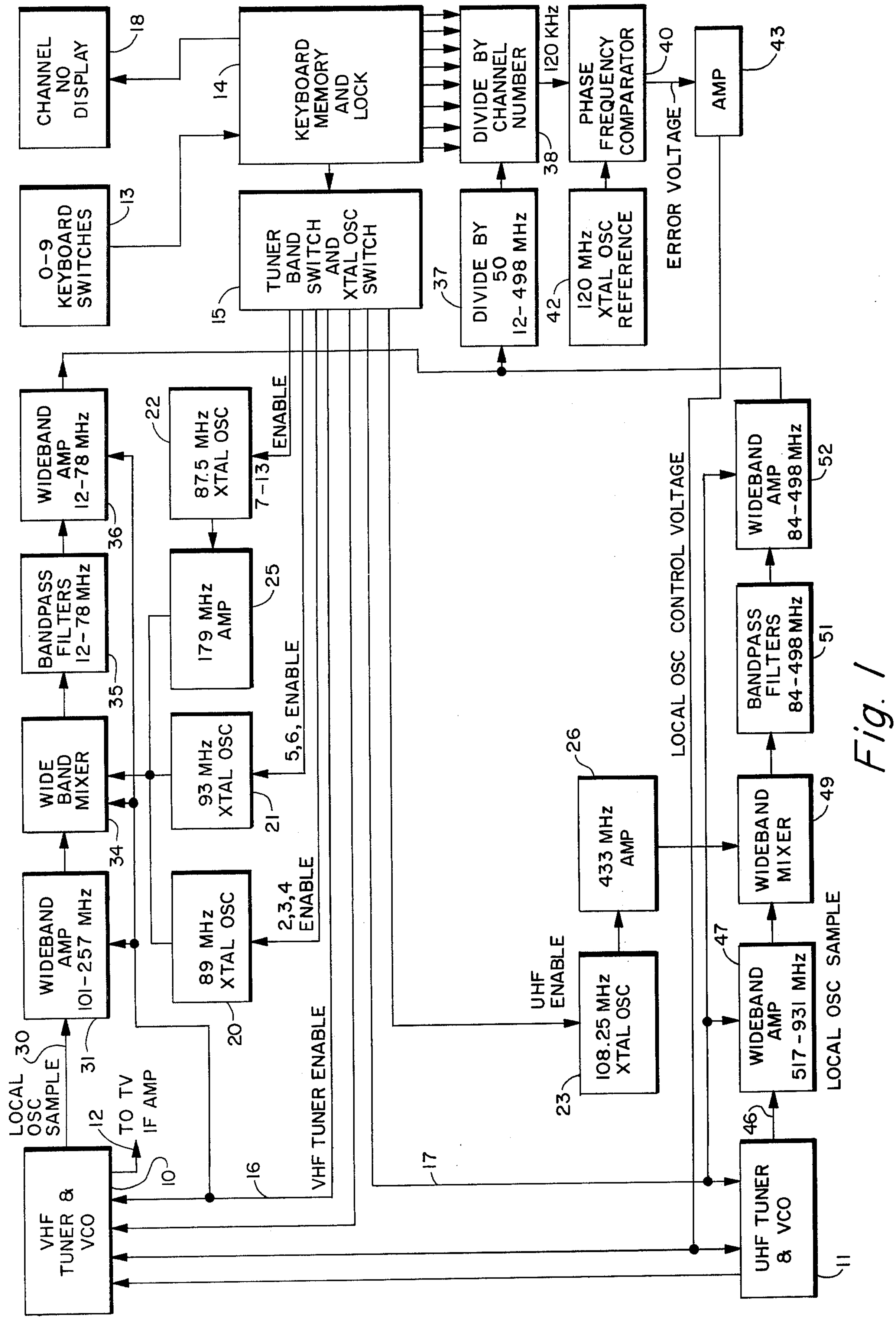
FIG. 1 is a block diagram of a system according to the preferred embodiment of the invention.

Referring now to the drawings, in which the same reference numbers are used in the several figures to designate the same or similar components, there is shown a tuning control system particularly suitable for use as a channel selection system for an electronically tuned television receiver. FIG. 1 is a block diagram of a channel selection and tuning control system used to control the local oscillator in the VHF and UHF tuner sections 10 and 11, respectively, of a television receiver. Each of the tuner sections 10 and 11 includes a voltage controlled oscillator for producing the local oscillator signal which is used to produce the signal supplied to the television IF amplifier stage.

Since the portions of the television tuners and receiver used to process, detect and reproduce the composite television signal do not constitute a part of this invention, those portions have not been shown. They may of any suitable standard configuration. In such present day television receivers, however, the tuners generally are divided into the two sections, VHF and UHF, illustrated as tuners 10 and 11 in FIG. 1. For any given channel, the local oscillator in only one of the tuner sections 10 and 11 is operative and the other oscillator is inoperative. Thus, whenever a VHF channel is selected, the VHF oscillator is controlled by way of a tuner enabling signal to produce the local oscillator signal, while the UHF oscillator is rendered inoperative. The controverse is true when the television receiver is tuned to a UHF channel. When the UHF oscillator is operative, its output signal generally is supplied through a portion of the VHF tuner to provide a common output on terminal 12 to the television receiver IF amplifier stages.

The system shown in FIG. 1 is a phase-locked loop control system for establishing and maintaining the frequency of the selected VHF or UHF voltage controlled tuner local oscillator which is operative to tune the receiver for the selected channel. A simple straightforward phaselocked loop system, however, using some type of a programmable frequency divider for selecting the proper channel is not practical for several reasons. First, with the standard 45.75 megahertz (MHz) picture IF carrier frequency, the local oscillator frequencies for the tuners range from a low 101 MHz for VHF channel 2 to a high of 931 MHz for UHF channel 83. Dividers operating at the 900 MHz end of this range are not available in quantity at low cost. In addition, while the interchannel spacings between all of the UHF channels and between different groups of the VHF channels is a standard 6 MHz spacing, a 10 MHz interchannel space exists between VHF channels 4 and 5, a 92 MHz spacing exists between VHF channels 6 and 7 (this is the spacing separating the low band and high band VHF channels) and a 260 MHz spacing appears between VHF channel 13 and the lowest UHF channel 14. These different interchannel spacings must be taken into consideration in the design of a channel selection and tuner control system. This is what has been done in the system shown in FIG. 1.

In the system of FIG. 1, a keyboard switch section 13 is operated to directly select the desired channel number by selection comparable to the manner of entering data on an adding machine or simple hand-held or desk-top computer. The tens digit is entered first and the units digit is entered second for whatever VHF or UHF channel is desired. This information is supplied to a keyboard memory and lock circuit 14 which in turn controls a tuner band switch and crystal oscillator switch circuit 15.

This latter circuit performs two functions. First it selects and enables the voltage controlled local oscillator in either the UHF and VHF tuner in accordance with the channel which has been selected by the operation of the keyboard switches. As stated previously, only one of the oscillators in either of the tuners 10 and 11 is enabled for operation at any one time. This oscillator control is effected over the leads 16 and 17 for the VHF and UFH tuners, respectively. Second, the crystal oscillator switch section of the circuit 15 enables one of four crystal oscillators 20, 21, 22 and 23 for operation. These oscillators are gated off-set oscillators operating at frequencies uniquely related to the frequencies in the different sections of the VHF band of frequencies and the UHF band. Specifically, the oscillator 20 is an 89 MHz oscillator which is enabled whenever any one of VHF channels 2, 3 and 4 is selected. Similarly, the oscillator 21 is a 93 MHz oscillator which is enabled for operation whenever channels 5 or 6 are selected. Oscillator 22 is an 87.5 MHz oscillator which is selected whenever any one of the high band VHF channels 7 through 13 is chosen for tuning the television receiver. The output of the oscillator 22 is doubled in frequency by a 179 MHz amplifier circuit 25 which, in conjunction with the oscillator 22, operates as a composite 179 MHz oscillator circuit.

Whenever a UHF channel is selected by operation of the keyboard switch 13, the UHF gated offset oscillator 23 is driven into operation and the VHF oscillators 20, 21 and 22 are inoperative. The frequency of operation of the oscillator 23 is 108.25 MHz, and this is effectively multiplied by four in a 433 MHz amplifier 26 which operates in conjunction with the oscillator 23 as a composite 433 MHz oscillator whenever a UHF channel is selected.

If a VHF channel is selected, the local oscillator frequency sample is supplied over a lead 30 through a wide-band amplifier 31 (passing signals from 101 to 257 MHz) to a first input of a wideband mixer 34. The other input of the wideband mixer is connected in common to the outputs of the oscillators 20 and 21 and the output of the amplifier 25.

Whenever a VHF channel is selected, only one of the oscillators 20, 21 or 22 is rendered operative in accordance with whichever channel is selected, so only one oscillator input is supplied to the wideband mixer from these three oscillators. The output of the mixer circuit then passes through a bandpass filter 35 having a frequency passband of 12 to 78 MHz and this output is further amplified in a 12 to 78 MHz amplifier 36. The amplifiers 31 and 36 and the mixer 34 are enabled for operation by the signal on the lead 16 at the same time the VHF local oscillator is enabled.

In order to utilize the signal at the output of the amplifier 36 in a phase-locked loop, it is supplied to a first fixed frequency divider 37 which is selected to divide the frequency by 50. This frequency divider has an operating range extending from 12 to 498 MHz which covers the full range of frequenices in the system for the lowest VHF channel (channel 2) to the highest UHF channel (channel 83). The output of the divide-by-50 frequency divider 37 is supplied as the signal input to a programmable frequency divider 38. This programmable divider is programmed to divide the input frequency directly by the channel number in accordance with programming outputs obtained from the output of the keyboard memory and lock circuit 14.

The frequencies selected for the gated offset oscillators 20, 21 and 22 are uniquely selected; so that when the output signals from the oscillators 20, 21 and the amplifier 25 are mixed with the standard local oscillator frequency for a television receiver operating with a 45.75 MHz picture If frequency, the output of the programmable divider 38 for a properly tuned VHF channel is always 120 kilohertz. A phase-frequency comparator circuit 40 is supplied with the output of the programmable divider 38 and with a 120 kilohertz reference signal from a reference oscillator 42 and produces an error or control voltage in a conventional manner, normally associated with phase-locked loop systems. This error voltage is amplified by a suitable amplifier 43, the output of which comprises the local oscillator control voltage which is applied over a lead 44 in common to the voltage controlled oscillators in both the VHF and UHF tuners 11. For the description of the system which has been made thus far, the voltage on the lead 44 only has effect on the operation of the VHF oscillator since only that oscillator is rendered operative for selection of any VHF channel.

If a UHF channel is selected by entry through the keyboard switch 13, the UHF voltage controlled oscillator in the tuner 11 is rendered operative and the oscillator in the VHF tuner 10 is inoperative. Thus, any control voltages appearing on the lead 44 for selection of a UHF channel then operate to control the frequency of operation of the UHF oscillator in a standard manner. AS with the VHF oscillator output, the local oscillator frequency for the UHF oscillator is supplied over a lead 46 and passes through a wideband amplifier 47 (517 to 931 MHz) to one input of a second wideband mixer 49. The other input to the mixer 49 is obtained from the output of the amplifier 26, which is the 433 MHz offset oscillator output frequency from the now operative oscillator 23. The oscillator 20, 21 and 22 are not operating whenever a UHF channel is selected.

The output of the mixer 49 is in the frequency range between 84 and 498 MHz and is passed by a bandpass filter circuit 51 and a wideband amplifier 52 to the input of the divide-by-50 divider circuit 57. The divided down signal is supplied in the same manner as when a VHF channel is selected to the input of the programmable frequency divider 38 where it is divided directly by the UHF channel number. As with the VHF offset oscillators, the frequency of the oscillator 23 is selected such that when the output signal from the fixed divider 37 is divided by the UHF channel number in the divider 38, the output frequency of the divider 38 is 120 kilohertz when the channel is properly tuned. The operation of the phase-frequency comparator 40, reference oscillator 42, and amplifier 43 are the same for the UHF channels as for selection of a VHF channel. Similarly the wideband amplifiers 47 and 52 are enabled for operation by the signal on the lead 44 which enables the UHF tuner local oscillator.

The manner in which this system operates to permit direct division by the selected channel number to control the frequency used in the phase-locked loop system for generating the control voltage for the voltage control oscillators in the tuners 10 and 11 best can be understood by reference to the chart given below:

| Group | Channel Number (N) | Tuner Local Osc. Freq. (MHz) | Offset Osc. Freq. (MHz) | Input Freq. To Divider 37 (MHz) | Input Freq. To Divider 38 (KHz) |
|---|---|---|---|---|---|
| I | 2 | 101 | | 12 | 240 |
| | | | 89 | | |
| | 4 | 113 | | 24 | 480 |
| II | 5 | 123 | | 30 | 600 |
| | | | 93 | | |
| | 6 | 129 | | 36 | 720 |
| III | 7 | 221 | | 42 | 840 |
| | | | 179 | | |
| | 13 | 257 | | 78 | 1560 |
| IV | 14 | 517 | | 84 | 1680 |
| | | | 433 | | |
| | 83 | 931 | | 498 | 9960 |

The chart shows the channels divided into four groups (I to IV) which are determined by the non-six MHz interchannel spacings discussed previously. The tuner oscillator frequencies are the standard local oscillator frequencies which are used for television receivers having a 45.75 MHz IF picture carrier frequency.

Within each of the groups, the local oscillator frequencies are spaced at 6 MHz intervals. For example, for channels 2, 3 and 4 in Group I, the lowest local oscillator frequency is 101 MHz for channel 2. It is 107 MHz for channel 3 and is the indicated 113 MHZ for channel 4. The chart also shows the non-six MHz local oscillator spacings which occur between Groups I, II, III and IV because of the comparable non-six MHz spacings in the transmitted center frequency for those same channels. The offset oscillator frequency column shows the frequency which is applied to the wideband mixers 34 or 49 whenever a channel within the particular selected group is chosen by operation of the keyboard switch circuit 13. As stated previously, only one of the offset oscillators 20, 21, 22 or 23 is operating at any one time.

The input frequencies supplied to the input of the fixed frequency divider 37 also are shown in the second column from the right on the chart. These are the difference frequencies between the offset oscillator frequency and the tuner local oscillator frequency indicated on the chart. These difference frequencies then are divided by 50 in the divider 37 to produce the output frequencies (shown in kilohertz) in the righthand column of the chart. This is a straight-forward mathematical division and it can be verified for any channel on the chart.

The programmable frequency divider 38 then divides the frequency shown on the righthand column of the chart directly by the selected channel number, and when the local oscillator is operating at the correct frequency, the resultant is always 120 kilohertz. For example, whenever channel 2 is selected, the input to the divider is 240 kilohertz, this divided by 2 produces the desired 120 kilohertz output. Similarly, if channel 6 in Group II is selected, the input to the programmable divider 38 is 720 kilohertz. This frequency divided by 6 is the desired 120 kilohertz. Likewise, for channel 10 the input to the divider 38 is 1,200 kilohertz. When this is divided by 10, the desired 120 kilohertz output is obtained. Finally, for UHF channel 44, the input to the frequency divider 38 is 5,280 kilohertz and when this is divided by the selected channel number (44) the resultant output is 120 kilohertz.

The system operates from this point out as a standard phase-locked loop system using a 120 kilohertz crystal oscillator 42 to supply the reference signal to the frequency comparator 40.

Figure 2:
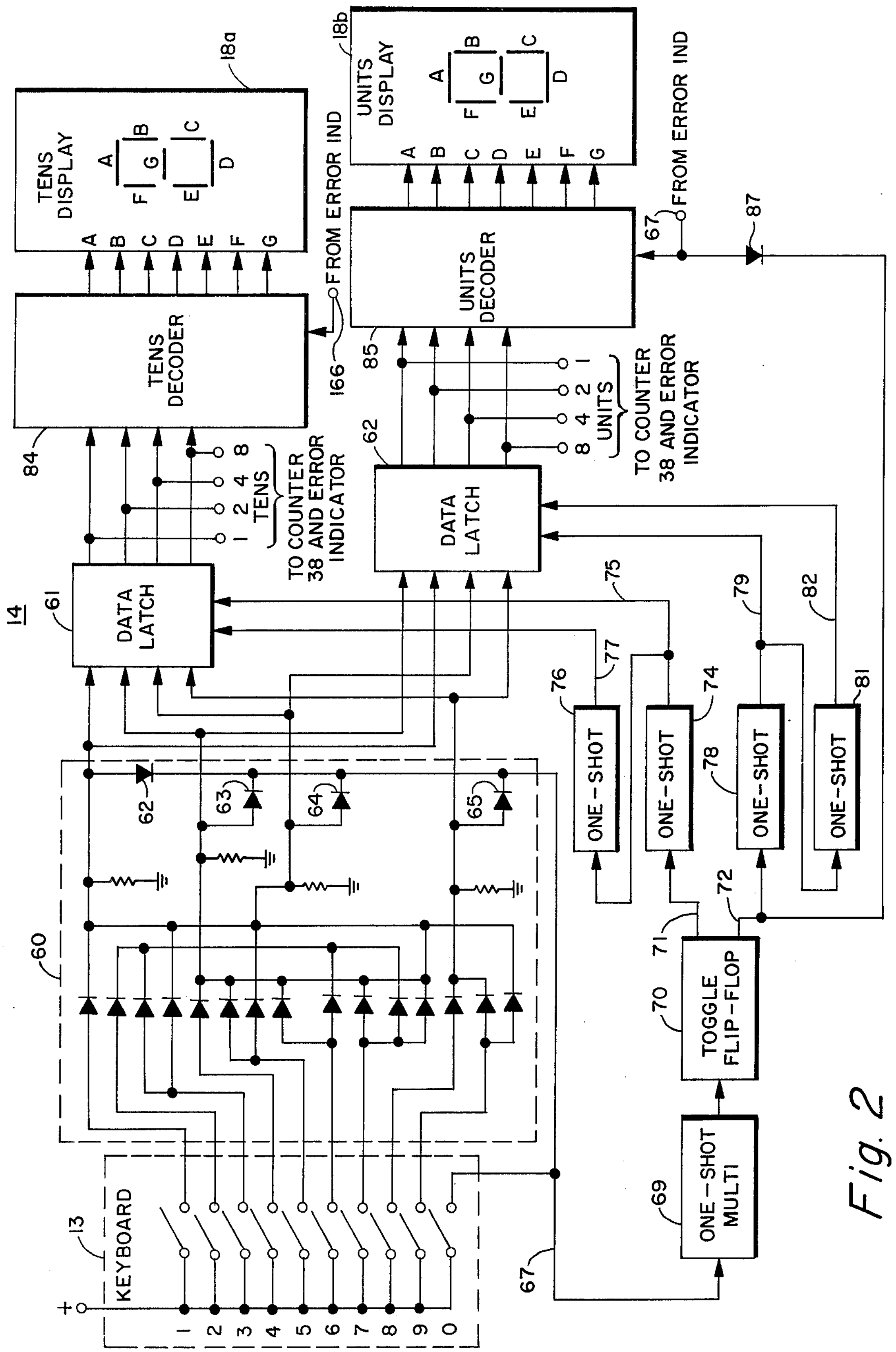
FIG. 2 is a more detailed block diagram of a portion of the system shown in FIG. 1.

Referring now to FIG. 2, the keyboard switch selection portion of the circuit 13, the keyboard memory 14 and channel number display 18 are illustrated. The keyboard 13 circuit comprises a conventional ten digit keyboard representing the digits 0 through 9, respectively. The switches for each of the digits are normally open, and whenever one of these switches is momentarily closed, such as by depression of a push button on the keyboard, a source of positive potential is coupled to corresponding inputs of a decimal-to-BCD diode decoding circuit 60 which passes the selected keyboard information on four BCD output lines to the inputs of a pair of first and second data latch circuits 61 and 62.

Four extra diodes 62, 63, 64 and 65 are included in the BVD decoder circuit 60 for supplying a positive pulse on a lead 67 whenever any switch in the keyboard 13 is closed. This pulse triggers a one-shot multivibrator 69 into operation. This multivibrator is used to remove the effects of contact bounce produced by the switches in the keyboard 13. The output of the one-shot multivibrator 69 drives a toggle flip-flop circuit 70 to change its state.

When power is first applied to the system, circuitry included within the toggle flip-flop 70 causes it always to assume the same initial state. The first pulse applied to it then causes it to produce a positive going output trigger pulse on an output lead 71 which is one of the two output leads 71 and 72 obtained from the toggle flip-flop 70.

An output pulse appearing on the lead 71 triggers into operation a one-shot multivibrator 74 which supplies a "clear" pulse on a lead 75 to the input of the data latch circuit 61 to remove any previously stored data. The output of the one-shot multivibrator 74 also is cascaded to the input of a second one-shot multivibrator 76 which supplies an output pulse on a lead 77 after the pulse on the lead 75 is removed by the change of the state of the multivibrator circuit 74. The pulse on the lead 77 then sets the data latch circuit 61 to store the BCD uncoded data which is applied to its inputs from the outputs of the BCD decoder circuit 60. The data latch 61 is the "tens" data latch circuit, so that the first number entered on the keyboard comprises the tens number for the selected channel. The data latch circuit 61 then holds this information until it next is reset or cleared by a pulse on the lead 75.

The time for the entry and latching of the data in the data latch circuit 61 after the selection switch in the keyboard circuit 13 initially is closed is very short, so that to the operator of the keyboard the entry of the selected data appears to be instantaneous. Release of the first key (switch) and then depression of the same or a different key in the keyboard 13 reinitiates the sequence. The decimal-to-BCD converter circuit 60 presents the new BCD encoded number to the inputs of the data latch circuits 61 and 62. The one-shot multivibrator 60 now triggers the toggle flip-flop 70 to its second state. In this state, the flip-flop 70 produces a positive trigger pulse on its output 72 to trigger a first one-shot multivibrator 78 into operation. The output pulse from the one-shot multivibrator 78 is applied over an output lead 79 to the "clear" input of the data latch circuit 62 for the units portion of the selected channel number. This clears any information previously stored in the circuit 62.

The one-shot multivibrator 78 also is cascaded to a second one-shot multivibrator 81 which subsequently applies a data entry pulse on a lead 82 to the data latch circuit 62 to cause the data latch circuit to store the BCD encoded data appearing on its inputs and to hold that data until it subsequently is cleared by another pulse on the lead 79. The operation of the cascaded one-shot multivibrators 78 and 81 in conjunction with the data latch circuit 62 is the same as the operation of the multivibrators 74 and 76 in conjunction with the data latch circuit 61. The system now has a desired channel entered into it and remains in this state until the next time a switch in the keyboard 13 is momentarily closed.

The outputs of the data latch circuits 61 and 62 comprise the BCD encoded information which was applied to their inputs, and this information is supplied to a tens decoder 84 and a units decoder 85, respectively. These decoders may be of standard configuration for decoding binary-coded-decimal (BCD) signals to signals necessary for driving a seven segment display. The tens decoder 84 drives the tens display **18*a* while the units decoder 85 drives the units display 18*b*. Any conventional seven segment display can be used for the displays 18*a* and 18*b*** and their operation is standard.

The output from the data latch circuits 61 and 62, respectively, also is supplied to the programmable counter 38 and to an error indicator circuit. The unique channel number which has been selected by the momentary closure of two switches in succession in the keyboard 13 is applied to the programmable counter 38 from the outputs of the data latch circuits 61 and 62 to cause that counter to divide by the selected channel number directly.

Whenever a new channel is selected in the system, it is desirable to blank out the units display **18*b* as soon as the tens number for the new channel is entered into the data latch circuit 61 causing it to be displayed in the tens display 18*a*. When this is done, the user of the receiver is given a visual indication that he must enter another number to complete his channel selection. This is accomplished by applying the output 72 of the flip-flop 70 to the input of the units decoder through an isolating diode 87.**

Whenever a complete two-digit channel number has been entered into the system, the output on the lead 72 from the toggle flip-flop 70 is always high, so that the diode 87 is back-biased. This permits the units decoder 85 to properly operate to drive the units display 18b to display some number representative of the selected units portion of the channel number. When the first number (the tens digit) for a new channel is entered, the output 72 of the flip-flop 70 goes low, while the output 71 is high. As stated previously, this initiates the entry of new data into the tens display 18a. When the output 72 goes low, however, the diode 87 becomes forward biased. This operates to cause the outputs of the units decoder 85 all to go to a blanking conition. Thus, the units display **18*b* is immediately blanked or erased, and no number appears in it until the next operation of a switch in the keyboard 13, which changes the state of the flip-flop 70 to cause its output 72 to once again go high. This reestablishes the reverse-bias on the diode 87 and permits the units decoder 85 to drive the units display 18*b* in accordance with the input applied to the units decoder 85.**

Figure 3:
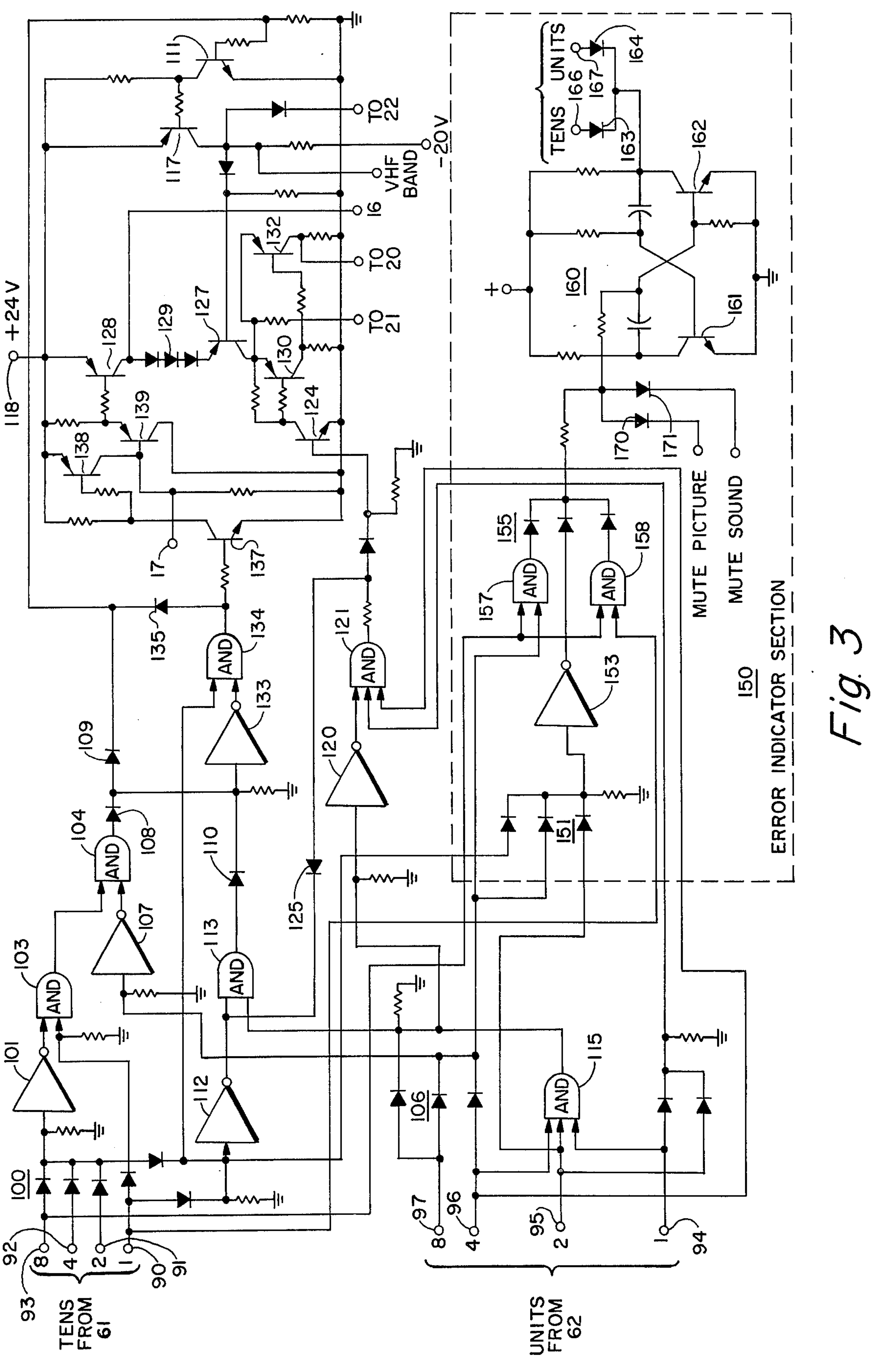
FIG. 3 is a circuit diagram of a preferred embodiment of a circuit used in a portion of the block diagram system of FIG. 1.

FIG. 3 shows details of the tuner band switch and crystal oscillator switch circuit 15, along with an error indicator section to indicate to the operator of the television receiver when he has selected a non-existent channel, such as channels 0, 1 and 84 to 99. These channel numbers are capable of selection on the keyboard circuit 13 but are not assigned to any valid channel which a television receiver can receive.

The BCD encoded "tens" number from the data latch circuit 61 is applied to the terminals 90 to 93, respectively, as shown in FIG. 3, and represent the BCD digits 1, 2, 4 and 8, respectively. Similarly, the BCD encoded output of the data latch circuit 62 for the "units" number is applied to input terminals 94, 95, 96 and 97 of FIG. 3. These terminals represent, respectively, the BCD numbers 1, 2, 4 and 8 for the units. The combined inputs on terminals 90 through 97 must be decoded to supply B+ operating voltage to the proper voltage controlled oscillator in either the VHF tuner 10 or the UHF tuner 11, as well as to operate the VHF band switch and to energize the particular one of the oscillators 20, 21, 22 or 23 which is associated with the selected channel by supplying an enabling gating signal to it. This is accomplished by the tuner band switch and pre-scaler logic section of FIG. 3.

For the purpose of illustrating the operation of the circuit of FIG. 3, assume that whenever a desired BCD encoded output is obtained on one of the leads from the data latches 61 and 62, that the potential on such lead is high. This high output then is applied to the corresponding lead 90 through 97 in FIG. 3. The terminals 91 through 93 are connected through a three diode OR gate 100 to an input of an inverter 101. Thus, whenever the tens numbers 2 through 9 are selected, a high input is applied to the inverter 101, so that its output is only high whenever 0 or 1 of the tens portion of a channel number, is selected.

This output from the inverter 101 comprises one of the two inputs of an AND gate 103. The other input to the AND gate 103 is applied through an isolating diode from the input terminal 90, so that this input is high whenever the tens digit or numbers 1, 3, 5, 7 or 9 are selected. The combination of these two inputs to the AND gate 103 is such that it produces a high output only when the tens number 1 has been selected by the keyboard 13.

This output in turn is coupled to one of two inputs of another AND gate 104. The other input to the AND gate 104 is determined by the signals present on the units input terminals 96 and 97. These correspond to BCD 4 and 8. These two terminals 96 and 97 are coupled through a two diode OR gate 106 to the input of an inverter 107; so that whenever any of the units numbers 4 through 9 are selected by the keyboard 13, the input to the inverter 107 is high. As a consequence, the output of the inverter 107 is only high whenever a units number 0 through 3 is selected on the keyboard 15. The output of the inverter 107 is connected to the second input of the AND gate 104, and the combination of the inputs to that AND gate are such it produces a high output whenever any of channels 10 to 13 are selected in the keyboard switch. This output is coupled through a pair of diodes 108 and 109 to the base of an NPN transistor 111 which comprises the VHF band switch input transistor.

The output of the AND gate 104, however, only accounts for VHF channels 10 through 13 and the VHF high band includes all of the channels 7 through 13. The input to the base of the transistor 111 for channels 7 to 9 is controlled from the output of an AND gate 113. A first input of the AND gate 113 is obtained from the output of an inverter 112 which is coupled through a diode OR gate to all four of the tens input terminals 90 through 93. This means that the output of the inverter 112 is high only when 0 is selected by the tens data latch circuit 61. The second input for the AND gate 113 is obtained from a diode OR gate, one input to which is supplied from an AND gate 115 having three inputs connected to the terminals 94, 95 and 96, respectively. Thus, the AND gate 115 supplies a high output only when the units member 7 is selected by the keyboard switch circuit 13. The terminal 97 is connected through the diode OR gate to the same input of the AND gate 113 to supply a high input whenever the numbers 8 or 9 are selected by the keyboard and stored in the data latch circuit 62.

The result is that the output of the AND gate 113 is high whenever channels 7 to 9 are selected, and this output is applied through a diode 110 to the junction of the diodes 108 and 109 so that the output of the diode 109 is high whenever any of the VHF channels 7 to 13 are selected. This drives the transistor 111 into conduction which in turn forward biases the PNP transistor 117 into conduction to apply nearly the full value of the +24 voltage appearing on the voltage supply terminal 118 to the VHF band switch lead connected to its collector and identified as such in FIGS. 1 and 3. At the same time, the collector of the transistor 117 is coupled through an isolating diode to the input of the crystal oscillator 22 to supply B+ operating voltage to that oscillator to render it operative (FIG. 1).

Whenever any of the other VHF channels 2 to 6 are selected, the outputs of the AND gates 104 and 113 go low so that the transistors 111 and 117 are rendered non-conductive. This causes the potential on the collector of the transistor 117 to drop to a negative value and this is applied to the VHF band switch output for the VHF tuner to indicate a low band VHF channel selection.

It is necessary to distinguish between selection of VHF and UHF channels to enable the proper VHF or UHF local oscillator and to cause proper operation of the tuner band switch circuit and the crystal oscillator switch circuit operation for channels other than channels 7 to 13 discussed above. This is accomplished by the use of an inverter 133 and a two input AND gate 134. The input to the inverter 133 is obtained from the diodes 108 and 110 operating as an OR gate to cause the input to the inverter 133 to be high whenever any of the VHF channels 7 to 13 are selected. This means that the output of the inverter 133 is high for selection of any channel number other than channels 7 to 13. Thus, it is high for numbers 0 through 6 and 14 through 99.

To remove the VHF channel selections below channel 7, the output of the inverter 133 is coupled to one input of an AND gate 134 which has coupled to its other input through an OR gate arrangement all of the tens input terminals 90, 91, 92 and 93. Thus, this second input to the AND gate 134 is high whenever any tens number is selected other than 0. The result of this is that the output of the AND gate 134 is high only when a number 14 through 99, indicative of UHF channels, is selected.

The output of the AND gate 134 is coupled through an isolating diode 135 to the base of the transistor 111 and also is coupled to the base of an NPN input transistor 137 to render it conductive for UHF channel selections. The transistor 137 is non-conductive for selection of VHF channels. This means that for VHF channels the potential on the collector of the transistor 137 is high, reverse-biasing a PNP transistor 138 into non-conduction. This in turn causes a PNP transistor 139, the base of which is coupled to the collector of the transistor 138, to be forward biased into conduction for VHF channel selection. Whenever the transistor 139 conducts, a relatively low potential is applied to the base of the PNP transistor 128, causing it to conduct for VHF channels. For UHF channel selections the conductivities of the transistors 137, 138, 139 and 128 are reversed from that just described.

Assume now that VHF channel 5 or 6 is selected. When this occurs the potential on all of the tens input terminals 90 to 93 is low, so that the output of the inverter 112 is low. The output of the AND gate 115, which is high only when the units data latch indicates selection of number 7, is coupled through an inverter 120 to one of three inputs to an AND gate 121. The output of the inverter 120 is high whenever the unit numbers 1 to 6, 8 and 9 are selected. A second input to the AND gate 121 is supplied directly from the terminals 94 and 95 through a diode OR gate, so that this input is high whenever the units numbers 1 to 3, 5 to 7, and 9 are selected. The third input for the AND gate 121 is obtained directly from the terminal 96 which is high whenever any of the numbers 4 through 7 are selected. From this it can be seen that the output of the AND gate 121 is only high when numbers 5 and 6 are present in the units data latch circuit 62, with any number selected in the tens data latch 61.

Since VHF channels 5 and 6 are selected only when the tens number is 0, a diode 125 is connected between the output of the AND gate 121 and the output of the inverter 112. As stated previously, the output of the inverter 112 is low for all tens numbers except 0. Thus, if any tens number is selected other than 0, the diode 124 is forward biased and operates to shunt the output of the AND gate 121 to a low potential. If, however, the tens number is 0, the output of the inverter 112 is high and the diode 125 is back-biased, presenting essentially an open circuit to the output of the AND gate 121. For this situation, selection of the unit numbers 5 and 6 then is indicative of selection of channels 5 or 6 and the output of the AND gate 121 forward biases into conduction an NPN transistor 124.

Under these circumstances of operation, the transistor 117 also is non-conductive, so that a forward biasing low potential is applied to the base of a PNP transistor 127 to bias it into conduction. Since a VHF channel has been selected, the PNP transistor 128 also is conductive at this time. This transistor is coupled between the positive voltage supply terminal 118 and the emitter of the transistor 127 through three voltage dropping diodes 129. As a consequence, a positive potential appears on the collector of the transistor 127, forward-biasing another PNP transistor 130 into conduction.

This causes a positive potential to appear on the collector of the transistor 130 and this is applied as an enabling gating potential to the 93 MHz oscillator 21 (FIG. 1). At the same time this positive potential reverse-biases a PNP transistor 132 so that it is reduced non-conductive to apply a low potential to the 89 MHz oscillator 20 (FIG. 1), so that the oscillator 20 does not operate at this time.

Whenever a VHF channel 2, 3 or 4 is selected, the outputs of the AND gates 104 and 121 both are low, so that the transistors 111 and 124 are non-conductive. At the same time, the output of the AND gate 134 also is low and the transistor 127 remains non-conductive. Under this condition of operation, the transistor 130 is non-conductive, causing the potential on the base of the transistor 132 to drop near ground potential. This forward biases the transistor 132 into conduction to supply the B+ operating potential from the conductive transistors 127 and 128 through the transistor 132 to the 89 MHz crystal oscillator 20, enabling that oscillator for operation. The near ground potential which is applied to the base of the PNP transistor 132 at this time also is applied to the 93 MHz crystal oscillator 21 rendering it non-operative. Since the transistor 111 is non-conductive, the transistor 117 also is non-conductive at this time, so that the VHF band switch is at a low potential indicative of a low band VHF channel.

It also should be noted that whenever the transistor 128 is conductive, indicative of selection of a VHF channel, the B+ potential on its collector is applied to the lead 16 to supply operating potential to the voltage controlled oscillator in the VHF tuner, the amplifiers 31 and 36, and the mixer 34.

Whenever a number indicative of a UHF channel, 14 through 99, is selected a positive potential is applied through the diode 135 to render the transistors 111 and 117 conductive. As stated previously, when the transistor 117 conducts, a positive potential is applied to the VHF band switch output for the VHF tuner 10. This is desirable for operation of the UHF tuner since the output of the UHF tuner is passed through the VHF tuner from which it is applied to the IF amplifier stages of the television receiver. Because of problems which are not important to the operation of the system disclosed here, it is desirable to have the VHF tuner operating in its high band mode of operation. The fact that the output of the conductive transistor 117 also renders the oscillator 22 operative at this time is of no consequence, since the local oscillator in the VHF tuner 10 and the mixer 34 are not enabled due to the fact that the transistor 128 is rendered non-conductive whenever a UHF channel is selected. Thus, the output signals from the oscillator amplifier 25 are blocked.

Selection of a UHF channel causes a positive potential to be applied from the output of the AND gate 134 to drive the transistor 137 conductive. This in turn renders the transistor 138 conductive to apply an enabling potential from its collector to the UHF tuner local oscillator 11, amplifiers 47 and 52, and the gated offset oscillator 23 for the UHF channel pre-scaling operation. This output is indicated as a common output on lead 17 in FIG. 3, but it is the same enabling potential which is identified as the UHF tuner enable on lead 17 and the UHF enable input to the oscillator 23 from the circuit 15 of FIG. 1. As stated previously, when the transistor 138 is conductive the transistors 139 and 128 are non-conductive for the UHF channel selection.

Since there is no restriction on the different combinations of two digits which can be entered into the system by the switches of the keyboard switch circuit 13, it is necessary to give the operator of the system some indication when he has selected a number which is for a non-valid channel, that is, a number which is not assigned to a transmitted channel in the VHF or UHF frequency spectrums. Such numbers are 00, 01, and 84 to 99 out of the total of the two digit numbers which can be selected by the keyboard switch circuit 13. An indication of selection of such a non-valid number is made by the error indicator section 150 shown enclosed in dotted lines in FIG. 3.

The first input for the error indicator section 140 is applied through a three diode OR gate 151. The upper diode shown is provided with a high potential whenever any tens number other than 0 is selected and stored in the tens data latch circuit 61. The other two inputs to the diode OR gate 151 are coupled to the input terminals 95, 96 and 97, so that the output of the diode OR gate 151 is high for selection of any units number 2 through 9 with any tens selection. This is inverted by an inverter circuit 153 which produces a high output to one of three inputs of a diode OR gate 155 for selection of numbers 00 and 01.

An additional pair of AND gates 157 and 158 are connected to the other two inputs of the OR gate 155.

A first input to both of these AND gates is connected directly to the terminal 93 from the tens data latch circuit 61 to provide a high input whenever an 8 or 9 is entered by the keyboard into the tens data latch circuit 61. The second input for the AND gate 157 is coupled to terminals 96 and 97 to produce a high or positive input whenever any number 4 through 9 is selected by the keyboard and stored in the units data latch circuit 62. The combination of these two inputs to the AND gate 157 is such that its output is high only for selection of numbers 84 through 89 and 94 through 99. These are invalid channel selection numbers and this output is applied to the OR gate 155.

To identify selection of invalid channels 90 through 93 a second input to the AND gate 158 is coupled to the terminal 90 or 1 output of the tens data latch circuit 61. This input thus is high for entry of the numbers 1, 3, 5, 7 and 9 from the keyboard into the tens data latch circuit 61. The combination of the two inputs to the AND gate 158 results in a high output from the AND gate 158 whenever the number 9 is entered into the tens data latch circuit 61. This output also is supplied to the lower diode of the OR gate 155.

From the foregoing, it can be seen that the OR gate 155 produces a high going output whenever a selection is made for invalid numbers 00, 01 and 84 to 99. This high output is applied to the trigger input of a bistable multivibrator circuit 160, including a pair of NPN transistors 161 and 162 as the active elements. The multivibrator 160 is normally biased with the transistor 161 conductive and the transistor 162 non-conductive in the absence of any positive output signal from the OR gate 155. When the positive-going output signal from the OR gate 155 is received, the transistor 162 is biased into conduction, causing a near ground potential to appear on its collector. This forward biases a pair of diodes 163 and 164 which are connected respectively to a pair of output terminals 166 and 167. These terminals in turn are coupled to the tens and units decoders 84 and 85 and operate in these decoders to cause the outputs supplied by the decoders to the display units 18*a* and 18*b* to flash on and off. This error indication also could be used to entirely blank the tens and units display units 18*a* and 18*b* or to operate some other type of alarm indicator. AS soon as a valid channel number is entered into the system from the keyboard, the output of the OR gate 155 drops to a low potential, biasing off the transistor 162 to return the bistable multivibrator 160 to its original state of operation. This reverse biases the diodes 166 and 167 removing the alarm condition.

The output of the OR gate 155 also may be coupled through a pair of isolating diodes 170 and 171 to picture and sound muting circuits in the television receiver to mute the picture and sound when an invalid channel is selected.

A system has been built in accordance with the circuit described in FIGS. 1, 2 and 3 using standard off-the-shelf integrated circuit parts for the different portions of the control circuit illustrated in block diagram form. The various integrated circuits which were used are indicated below for the corresponding components shown in the drawings:

| Components in FIGS. 1 & 2 | Part Used (Motorola) |
|---|---|
| Divider 37 | MC1690L (Divide by 2) |
| | MC1678L (Divide by 5) |
| | MC12012L (Divide by 5) |
| Programmable divider | MC4016P (Divide by N-units) |
| | MC4016P (Divide by N-tens) |
| Comparator 40 | MC4044P |
| One-shot 69 | MC8601P |
| Flip-Flop 70 | ½ MC7479P |
| One-shots 74 and 76 | MC8602P (dual one-shot) |
| One-shots 78 and 81 | MC8602P (dual one-shot) |
| Data latch 61 and 62 | MC8308P |
| Tens decoder 84 | MC7447P |
| Units decoder 85 | MC7447P |

The above chart is for purposes of illustration only, showing the manner in which standard off-the-shelf integrated circuit parts can be used to implement the system. These parts are not to be considered limiting in any way. For the input to the divide-by-50 divider 37, it generally is desirable to use some type of Schmitt trigger circuit for the purpose of eliminating unwanted harmonics generated in the wideband mixer which could cause false triggering of the first divider. Such a Schmitt trigger circuit has not been shown in the block diagram of the system since the system concept is the same with or without such a trigger circuit.

The divide-by-50 divider 37 can be in any convenient form and need not be in a single integrated circuit package. As indicated in the chart, the divide-by-50 function of the divider 37 actually has been accomplished by cascading a divide-by-two divider with two divide-by-five dividers. The ones identified in the chart above are MECL high speed non-saturating logic, and the number 50 was chosen so that the maximum divided input frequency would be in the range of standard transistor-transistor logic, 10 MHz or less. For channel 83 this gives a frequency of 9.96 MHz.

The system which has been described is capable of accurate push button tuning of any TV channel of the VHF and UHF bands; and because it is a phase-locked loop system it operates to maintain correct tuning of the selected channel. The system requires two operations of the switches in the keyboard switch circuit 13 to select any VHF or UHF channel, so that it fully complies with the FCC requirements of compatible tuning.

I claim:

1. A tuning control system for a wave signal receiver capable of receiving signals in a plurality of frequency bands and having local oscillator means tunable to different transmitted signals in such bands in response to a tuning control signal, said tuning control system including in combination:

mixer means having an output and at least first and second input;

means for applying output signals from the local oscillator means to at least a first input of said mixer means;

first and second gated offset oscillator means enabled for operation by an enabling gating signal and each producing output signals on an output terminal thereof at a different frequency having a predetermined relationship with a different frequency band which the wave signal receiver is capable of receiving, the outputs of said first and second gated offset oscillators each being coupled with a second input of said mixer means;

selection means coupled with said first and second gated offset oscillator means for supplying an enabling gating signal to a selected one of said first and second gated offset oscillator means corresponding to the frequency band in which a desired selected transmitted signal appears;

programmable frequency divider means coupled with the output of said mixer means and coupled with and controlled by said selection means for dividing the frequency of the output signal of said mixer means by an amount having a predetermined relationship with said desired selected transmitted frequency;

reference oscillator means producing a reference signal on an output thereof;

phase comparator means having an output and first and second inputs coupled respectively to the output of said reference oscillator means and the output of said programmable frequency divider means, the output of said phase comparator means providing a control voltage for tuning the local oscillator means.

2. The combination according to claim 1 wherein the outputs of said first and second gated offset oscillators are coupled in common with the same second input of said mixer means.

3. The combination according to claim 1 wherein said mixer means includes first and second mixers, each having an output and each having first and second inputs;

said means for applying output signals comprises first and second means for supplying first and second local oscillator output signals to the first inputs of said first and second mixers, respectively; and the output of said first gated offset oscillator means is coupled with the second input of said first mixer and the output of said second gated offset oscillator means is coupled with the second input of said second mixer, the outputs of said first and second mixers being coupled in common to comprise the output of said mixer means.

4. The combination according to claim 3 further including a third gated offset oscillator means enabled for operation by an enabling gating signal, the output of said third gated oscillator means being connected in common with the output of said first gated offset oscillator means to the second input of said first mixer, said selection means further coupled for supplying an enabling gating signal to said third gated offset oscillator means.

5. A tuning control system for a television receiver capable of receiving signals in a plurality of frequency bands, and having local oscillator means tunable to different channels in such bands in response to tuning control signals, said tuning control system including in combination:

a mixer having an output and first and second inputs;

means for applying the output signals from the local oscillator to the first input of said mixer;

at least first and second gated offset oscillators enabled for operation by an enabling gating signal and each producing an output signal on an output terminal thereof at a different frequency, the output frequency of each of said gated offset oscillators having a predetermined relationship with a different frequency band which the television receiver is capable of receiving, the outputs of said gated offset oscillators coupled in common with the second input of said mixer;

channel selection means coupled with said gated offset oscillators for supplying an enabling gating signal to one only of said gated offset oscillators corresponding to the band of frequencies in which a selected channel appears;

programmable frequency divider means coupled with the output of said mixer and coupled with and controlled by said channel selection means for dividing the output frequency of said mixer by an amount having a predetermined relationship to the number of the channel selected by said channel selection means;

a reference oscillator producing on an output thereof a reference signal having a predetermined frequency; and phase comparator means having an output and having a first input coupled with the output of said reference oscillator and a second input coupled with the output of said programmable frequency divider means and producing a control signal on the output thereof for controlling the frequency of operation of the local oscillator means.

6. The combination according to claim 5 further including a third gated offset oscillator enabled for operation by an enabling gating signal and producing an output signal at a third different frequency on an output terminal thereof, with the output terminal of said third gated offset oscillator coupled in common with the output terminals of said first and second gated offset oscillators, said channel selection means further coupled with said third offset oscillator for supplying an enabling gating signal thereto.

7. The combination according to claim 6 wherein said means for applying the output signals from the local oscillator to the first input of said mixer applies VHF local oscillator output signals to such mixer input, said first, second and third gated offset oscillators produce output signals at 89 megahertz, 93 megahertz, and 179 megahertz, respectively, and wherein said programmable frequency divider means comprises a first fixed frequency divider section coupled with the output of said mixer for dividing the output frequency thereof by 50 and a programmable frequency divider section, the input of which is coupled with the output of said fixed frequency divider section, said programmable frequency divider section coupled with said channel selection means and dividing directly by the selected channel number; and the frequency of the reference signal supplied by said reference oscillator is 120 kilohertz.

8. The combination according to claim 7 further including oscillator selection switching means coupled with said channel selection means for supplying said enabling gating signal to said first gated offset oscillator whenever channels 2, 3, or 4 are selected by said channel selection means, for supplying said enabling gating signal to said second gated offset oscillator whenever channels 5 and 6 are selected by said channel selection means, and for supplying said enabling gating signal to said third gated offset oscillator whenever any one of channels 7 to 13 is selected by said channel selection means.

9. A tuning control system for a television receiver capable of receiving signals in VHF and UHF frequency bands and having first and second local oscillators tunable to different channels in such VHF and UHF frequency bands, respectively, in response to tuning control signals, said tuning control system including in combination:

first and second mixers, each having an output and each having first and second inputs;

means for applying the output signal of the first local oscillator to the first input of said first mixer;

means for applying the output signal of the second local oscillator to the first input of said second mixer;

a first gated offset oscillator producing an output signal on the output terminal thereof at a first predetermined frequency having a predetermined relationship with the VHF band of frequencies which the television receiver is capable of receiving, the output of said first gated offset oscillator being coupled with the second input of said first mixer;

a second gated offset oscillator producing an output signal on the output terminal thereof at a frequency having a predetermined relationship with the UHF band of frequencies which the television receiver is capable of receiving, the output of said second gated offset oscillator being coupled with the second input of said second mixer;

channel selection means for selecting channels in said VHF and UHF frequency bands and coupled with said gated offset oscillators for causing said first gated offset oscillator to supply signals to said first mixer whenever a VHF channel is selected and for causing said second gated offset oscillator to supply signals to said second mixer whenever a UHF channel is selected;

programmable frequency divider means having an input coupled in common with the outputs of said first and second mixer means and controlled by said channel selection means for dividing the frequency of output signals from said mixer means by an amount a predetermined relationship with respect to the selected channel number;

a reference oscillator producing an output signal at a predetermined frequency; and phase comparator circuit means having an output and having a first input coupled with the output of said reference oscillator and a second input coupled with the output of said programmable frequency divider means for producing a control signal on the output thereof for controlling the frequency of operation of the first and second local oscillators.

10. The combination according to claim 9 wherein the output frequencies of said first and second gated offset oscillators and the frequency of said reference oscillator are such that said programmable frequency divider is operated to divide directly by the selected channel number to produce a signal of the same frequency as said reference oscillator whenever the local oscillator for the selected VHF or UHF frequency band produces an output signal at a frequency corresponding to the selected channel.

11. The combination according to claim 10 wherein said programmable frequency divider comprises a first fixed frequency divider stage for dividing the output signals from said mixers by 50, and a second programmable divider stage having an input coupled with the output of said first fixed divider stage for directly dividing such output by the selected channel number to produce the output coupled with the second input of said phase comparator circuit means.

12. The combination according to claim 11 wherein the frequency of said reference oscillator is 120 kilohertz, the frequency of said second gated offset oscillator is 433 megahertz and the frequency of said first gated offset oscillator is one of the following frequencies: 89 megahertz, 93 megahertz, 179 megahertz.

13. A tuning control system for a television receiver capable of receiving channels in VHF and UHF frequency bands and having VHF and UHF local oscillators tunable to different channels in such bands, respectively, in response to a tuning control signal, said tuning control system including in combination:

a first mixer circuit having an output and first and second inputs;

a second mixer having an output and first and second inputs;

means for coupling the output of the VHF local oscillator with the first input of said first mixer circuit;

means for coupling the output of the UHF local oscillator with the first input of said second mixer circuit;

first, second and third gated offset oscillators each producing an output signal on an output terminal thereof at a different frequency, the output frequency of said first offset oscillator having a predetermined relationship with the VHF frequencies for channels 2, 3 and 4, the output frequency of said second offset oscillator having a predetermined relationship with the frequencies of VHF channels 5 and 6, and the output frequency of said third offset oscillator having a predetermined relationship with the VHF channels 7 to 13, the outputs of said first, second and third gated offset oscillators coupled in common with the second input of said first mixer circuit;

a fourth gated offset oscillator producing an output signal on the output terminal thereof having a predetermined frequency relationship with the UHF channels which the television receiver is capable of receiving, the output of said fourth gated offset oscillator coupled with the second input of said second mixer circuit;

channel selection means providing an output indicative of the channel to which the television receiver is to be tuned;

oscillator enabling switch means coupled with the channel selection means and responsive thereto for selectively enabling for operation only one of said first, second, third and fourth gated offset oscillators corresponding to the channel selected by said channel selection means;

programmable frequency divider means having an input coupled in common with the outputs of said first and second mixer circuits and coupled with said channel selection means and responsive thereto to divide the output frequency from said first and second mixer circuits by a predetermined amount corresponding to the selected channel number;

reference oscillator means producing output signals at a predetermined frequency on an output terminal thereof; and phase comparator circuit means having an output and having a first input coupled with the output of said programmable frequency divider means and having a second input coupled with the output terminal of said reference oscillator means for producing a tuning control signal on the output thereof for controlling the frequency of operation of the VHF and UHF local oscillators.

14. A tuning control system according to claim 13 wherein said programmable frequency divider means comprises a first stage for dividing the output frequency from said first and second mixer circuits by a predetermined fixed amount and a second stage for dividing the output signals from the first stage directly by the channel number.

15. The combination according to claim 14 wherein the output frequency of said first offset oscillator means is 89 megahertz, the output frequency of said second oscillator means is 93 megahertz, the output frequency of said third offset oscillator means is 179 megahertz, the output frequency of said fourth offset oscillator means is 433 megahertz, and the output frequency of said reference oscillator is 120 kilohertz.

* * * * *